United States Patent [19]

Brooks et al.

[11] 4,141,458
[45] Feb. 27, 1979

[54] WAFER TRANSPORT SYSTEM

[75] Inventors: Norman B. Brooks, Carlisle; Michael M. Olmstead, Bedford, both of Mass.

[73] Assignee: Pass-Port Systems Corporation, Billerica, Mass.

[21] Appl. No.: 799,547

[22] Filed: May 23, 1977

Related U.S. Application Data

[62] Division of Ser. No. 580,350, May 23, 1975, Pat. No. 4,030,622.

[51] Int. Cl.² .................. B65B 21/02; B65G 1/06
[52] U.S. Cl. .......................... 214/301; 214/16.4 R
[58] Field of Search .................. 214/301, 310, 16.4 R; 198/752, 759, 769

[56] References Cited
U.S. PATENT DOCUMENTS

| | | | |
|---|---|---|---|
| 2,746,598 | 5/1956 | Sherwen | 198/769 |
| 3,743,080 | 7/1973 | Musschoot | 198/759 |
| 3,789,711 | 2/1974 | Mead | 198/752 |
| 3,902,615 | 2/1975 | Levy et al. | 214/301 |
| 3,921,788 | 11/1975 | Roberson, Jr. et al. | 214/301 |

*Primary Examiner*—Lawrence J. Oresky
*Attorney, Agent, or Firm*—Cesari and McKenna

[57] ABSTRACT

An article handling system especially adapted for transporting thin, fragile articles such as silicon wafers into and out of a sealed environment such as a vacuum chamber comprises a vibratory track for transporting articles to be processed, an article handler associated with the track for removing articles from the track for processing and returning them to the track thereafter, and a pair of loader/unloaders at opposite ends of the track for intermittently supplying articles to be processed to the track and removing them therefrom after processing.

9 Claims, 14 Drawing Figures

FIG. I

WAFER TRANSPORT SYSTEM

This application is a division of United States Patent Application Ser. No. 580,350 filed May 23, 1975, by Norman B. Brooks and Michael M. Olmstead and assigned to the assignee of the present invention now U.S. Pat. No. 4,030,622 issued 6/21/77.

BACKGROUND OF THE INVENTION

A. Field of the Invention

The invention comprises an article handling system, and, more particularly, a wafer handling system. The system includes a transporter for transporting an article from one place to another, a transfer mechanism for removing the article from the track for processing and thereafter returning it for transport, and a loader/unloader for selectively feeding the articles to the track and receiving them therefrom. The system is especially useful in wafer vacuum processing operations.

B. Prior Art

Article handling systems are frequently used in industrial processing operations to minimize manual handling of various articles. In some fields, such as in the processing of semiconductor wafers, the processing is highly automated and numerous handling system of varied characteristics are utilized.

Semiconductor wafers are large, thin, flat wafers (typically, several inches in diameter and several thousandths of an inch thick) which are used in substantial quantities in the semiconductor industry to form electronic circuits and components; they are light in weight (fractions of ounces) and fragile. Successful processing of these wafers requires maintenance of high purity levels in all stages of the operation and much of the processing is therefore performed in a vacuum. One such operation involves selectively irradiating portions of the wafer with an ion beam to thereby modify its electronic characteristic. The irradiation takes place in a vacuum chamber under conditions of moderate to high vacuum ($10^{-4}$ torr to $10^{-7}$ torr); the ion beam is admitted to the chamber through a sealed port containing windows that are transparent to the beam.

A wide variety of techniques have heretofore been used to transport the wafers into and out of sealed chambers such as vacuum chambers. Such techniques have included, among others, the use of rotary carousels, endless conveyor belts, movable carriages, etc. With these techniques, the carriage element must at some point penetrate the housing of the chamber, and the penetration points must therefore be sealed so as to isolate the chamber from its ambient environment. Because of the need to accommodate the motion of the carriage element, these seals are of limited effectiveness in sealing the chamber, and thus the vacuum must be reestablished after each wafer is introduced. This is time consuming and often greatly slows production.

In some systems the primary portion of the movable carriage element, together with its driving source, is located wholly within the chamber to help alleviate the pass-seal problem. Special precautions must then be taken to prevent loss of the lubricant element in the driving source, since its loss will subject the driving source to failure and will also contaminate the environment within the chamber. Contamination is an especially serious problem in semiconductor processing.

Because of the stringent requirements placed on the seal and the transport system by the need to maintain high vacuum conditions, therefore, present transport systems, despite their frequently considerable cost and complexity, are only partially effective in maintaining a good vacuum and generally require frequent repair and maintenance.

Once the wafer or other article being processed is moved to the interior of the chamber, it must generally be further handled to position it for processing. For example, in the case of ion beam implantation of semiconductor wafers, the wafer must be held in a position transverse to the beam while the latter scans the wafer. Handling systems to accomplish this frequently are of considerble mechanical complexity, often due in part to the nature of the transport mechanism which carries the wafer into and out of the chamber.

In automated systems, the articles to be processed are often mounted on a carrier; in such cases they must be unloaded from the carrier for processing and returned to it thereafter. Loader/unloader systems to perform this function are frequently complex and often are not well matched mechanically to the transport system.

SUMMARY

A. Objects of the Invention

Accordingly, it is an object of the invention to provide an improved article handling system for moving articles into and out of sealed chambers.

Still a further object of the invention is to provide an improved article handling system for semiconductor wafer processing operations.

Another object of the invention is to provide an improved article transporter.

Still another object of the invention is to provide a transporter for semiconductor wafers.

Yet another object of the invention is to provide an improved transporter for moving semiconductor wafers into and out of a vacuum chambers.

Yet another object of the invention is to provide an article transfer mechanism which is especially adapted for use with the transporter herein described.

Yet another object of the invention is to provide an improved article loader/unloader that is especially simple in design and operation.

Still a further object of the invention is to provide an article loader/unloader that is especially well matched mechanically to the transport system disclosed herein.

Another object of the invention is to provide a wafer loader/unloader that is compatible with conventional wafer storage systems.

B. Brief Description of the Invention

Due to the stringent limitations imposed by vacuum processing operations on semiconductor manufacturing, the article handling system of the present invention will be described with particular reference to the carriage of semiconductor wafers into and out of a vacuum processing chamber where they are to be irradiated by an ion beam.

The first track section comprises a pair of pass-through valves positioned on the wafer entrance side of the chamber and spaced apart from each other by a track segment of sufficient length to accommodate a wafer between them. The valves themselves are of the type shown in U.S. Pat. No. 3,833,018 issued July 20, 1974 to Norman B. Brooks and assigned to the assignee of the present invention. The entrance and exit orifices of the valves comprise thin, elongated slots aligned with the track section; a rotor within each valve housing has a corresponding slot which is aligned with the entrance and exit orifices when the valve is opened for passage of a wafer therethrough.

The track segment between the valves is wholly enclosed to form a thin, flat conduit for accomodating a wafer in the interior thereof and isolating it from its environment; the opposed ends of the conduit are sealed to the corresponding valve walls and encompass the valve inlet and outlet orifices. The conduit and the valves thereby form an air-tight "forechamber" of limited volume which provides an intermediate isolation stage between the vacuum chamber and its environment. A second track section is formed by a similar pair of valves and track conduits on the wafer exit side of the chamber.

A third track section extends through the chamber itself and is joined at its opposite ends to the first and second track sections to form a single rigid track with them. Elliptical bellows of sufficient cross-section to encompass the entrance and exit apertures, and thus the track section passing through them, extend between the chamber housing on the entrance and exit sides thereof and the innermost valve of the first and second track sections, respectively. These bellows seal the chamber apertures so that access to the chamber interior is obtained only via the valves and their corresponding forechambers.

The valves and their connecting track sections form an extended, continuous, rigid track of substantial mass. The track is forced to undergo small amplitude vibrations by means of a pair of vibrators which are attached to the yoke from which the track is suspended. The vibration has a first displacement component perpendicular to the track which repetitively lifts wafers momentarily out of contact with the track, and a second displacement component directed along the track which advances the wafers along the track by a minute amount each time they are lifted off the track. Although the incremental advance is small during a given vibration cycle, the vibrations occur at a sufficiently rapid rate, (e.g. sixty cycles per second, which is the common electrical line frequency in the United States) to advance the wafers along the track at an appreciable rate.

As noted previously, the track and the vacuum chamber are mounted independently of each other. The bellows which are connected between the track and the chamber vibration-isolate the chamber from the track. This minimizes the driving energy required for the track. Further, it facilitates precise processing of the wafers within the chamber.

The valves on the entrance and exit sides of the chamber are actuated by corresponding solenoids. The various valves are operated in sequence to move a wafer from the exterior of the chamber, into the forechamber, and then into the main vacuum chamber. Once within the chamber, the wafer is removed from the track at a wafer processing station comprising a platen which is detachably connected to the track and normally forms part of it. The platen is connected to a rotatable shaft and is rotated upwardly from the track and into a processing position as the shaft rotates. In this position, the platen, and thus the housing to which it is ultimately connected, are vibration-decoupled from the track and thus the housing is immune to vibration during processing. This allows the next wafer to be processed to be moved into the forechamber during processing without disturbing the wafer being processed, and this thereby accelerates the over-all processing rate. The positions of the wafers is optically sensed at various stages to control the sequencing.

Two different platens are described herein. In a first embodiment the platen comprises a cylindrical plate having an inwardly sloping edge; it sits in the track during transport of the wafer into the chamber and vibrates with the track. A pair of arms extending transversely from a rotary shaft swing the platen out of the track once the wafer moves into it and thereby vibration-decouples the platen and its wafer from the track during processing. In another embodiment, the platen is shaped to fit into a recess in the track without touching it and with the surface of the platen positioned slightly below that of the track. "Islands" extend upwardly from the track through apertures in the platen. These islands vibrate with the track and receive the wafer thereon. The platen, which is connected to an arm extending transversely from a rotary shaft picks up the wafer from these islands for processing. The platen is thus vibration-decoupled from the track at all times.

The simple yet effective loader described herein is particularly adapted to the wafer transporter. It uses a casette having a number of separate compartments for accomodating the wafers therein and orienting them with their flat surfaces parallel to each other. Wafers are slid into and out of the respective compartments through an open face thereof. The casette is mounted on an index mechanism which orients the casette vertically so that the wafers are horizontal. A tongue-like extension of the track extends into the open face of the casette beneath the lowermost of the wafers to be processed. The index mechanism indexes the casette downwardly, one compartment at a time, so that successive wafers contact the tongue. On contact, the vibration of the tongue carries each wafer out of the casette and onto the track for processing. A similar loader/unloader at the opposite end of the track receives the wafers from the track after processing and loads them into a corresponding casette.

DETAILED DESCRIPTION OF THE INVENTION

The foregoing and other and further objects and features of the invention will be more readily understood from the following detailed description of the invention when taken in conjunction with the accompanying drawings in which.

Figure 1:
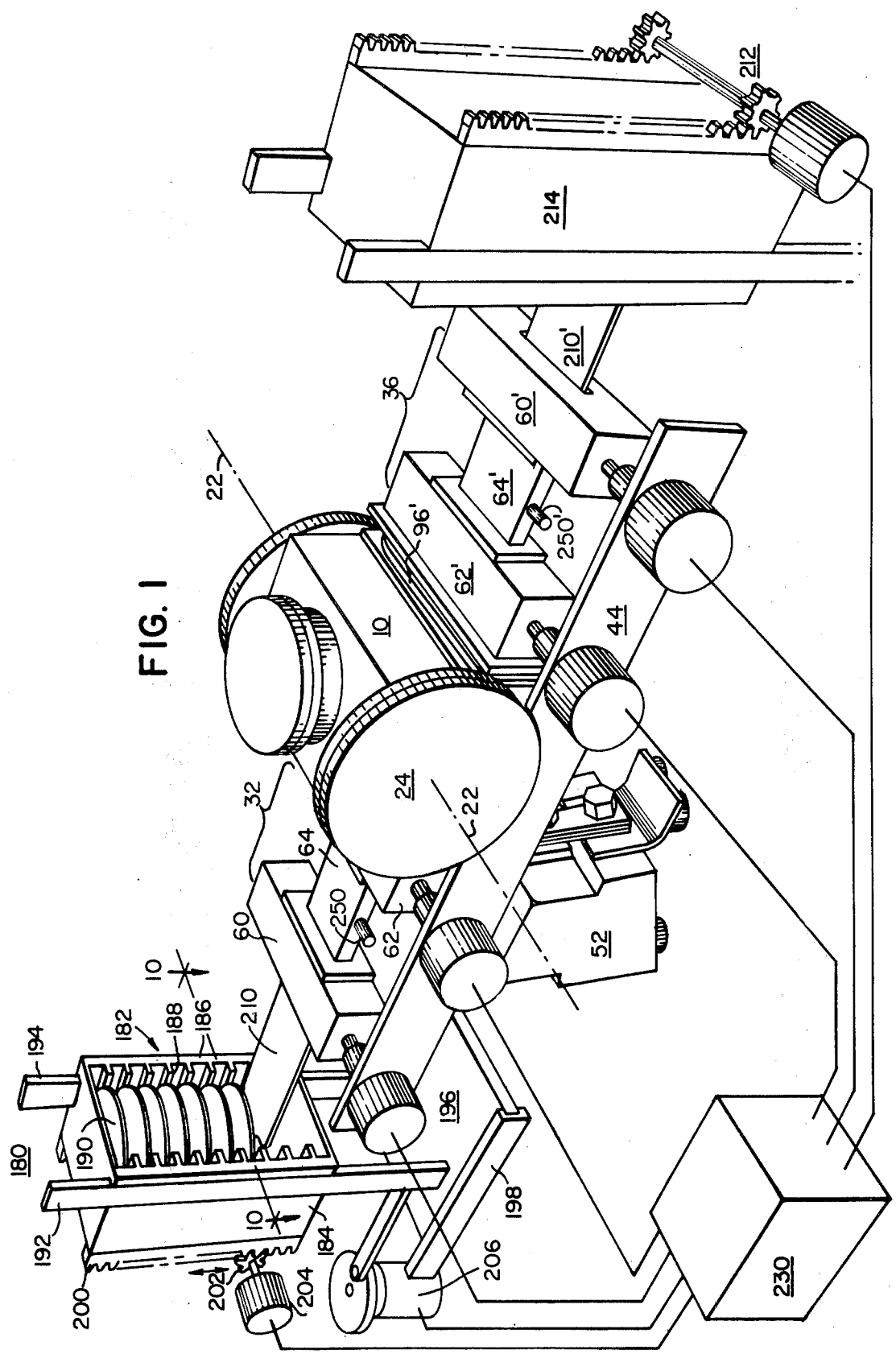
FIG. 1 is a view in perspective of a wafer ion-implantation chamber incorporating a wafer handling system in accordance with the present invention.
Figure 2:
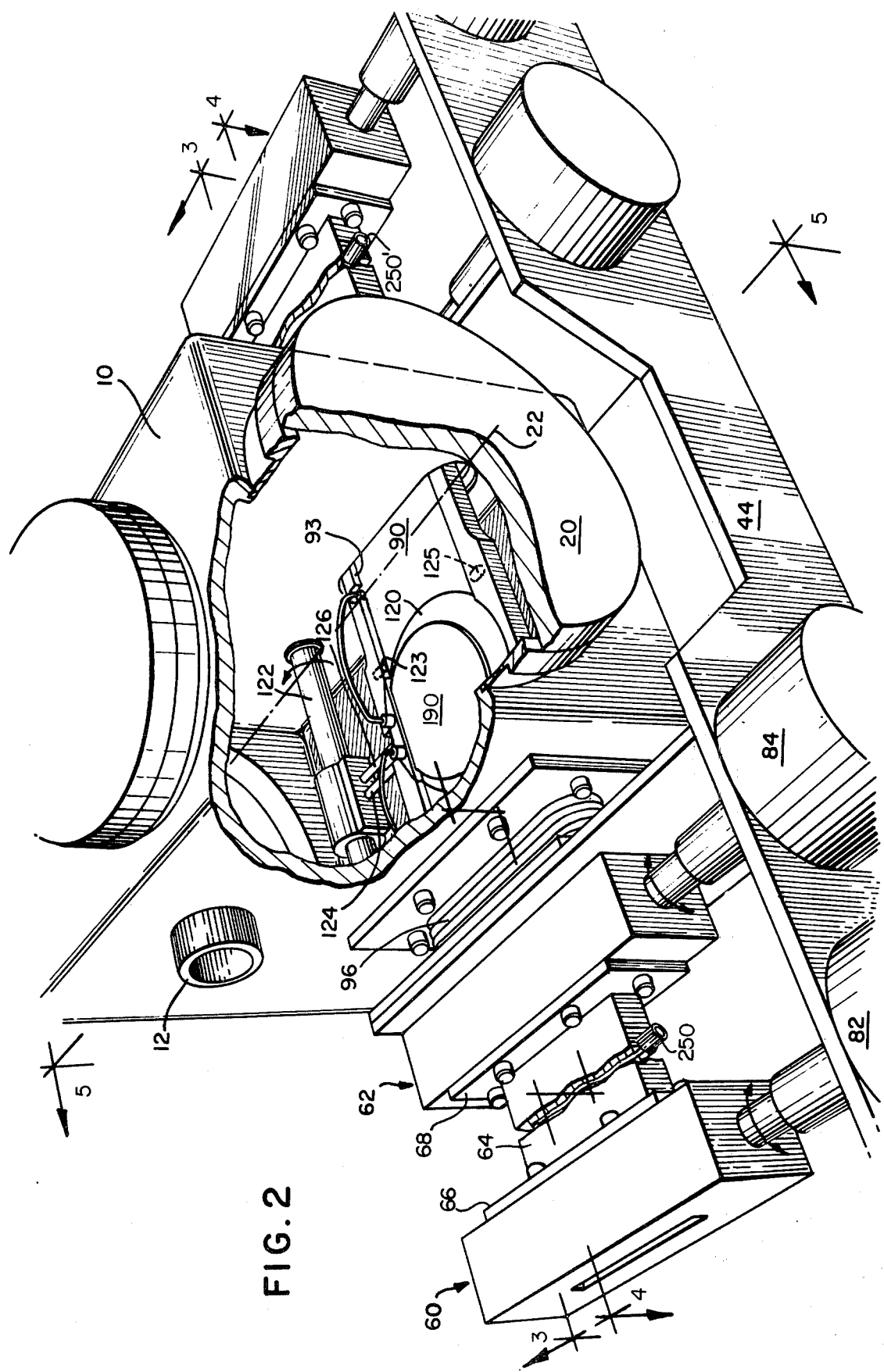
FIG. 2 is an enlarged view in perspective of the vacuum chamber of FIG. 1.
Figure 3:
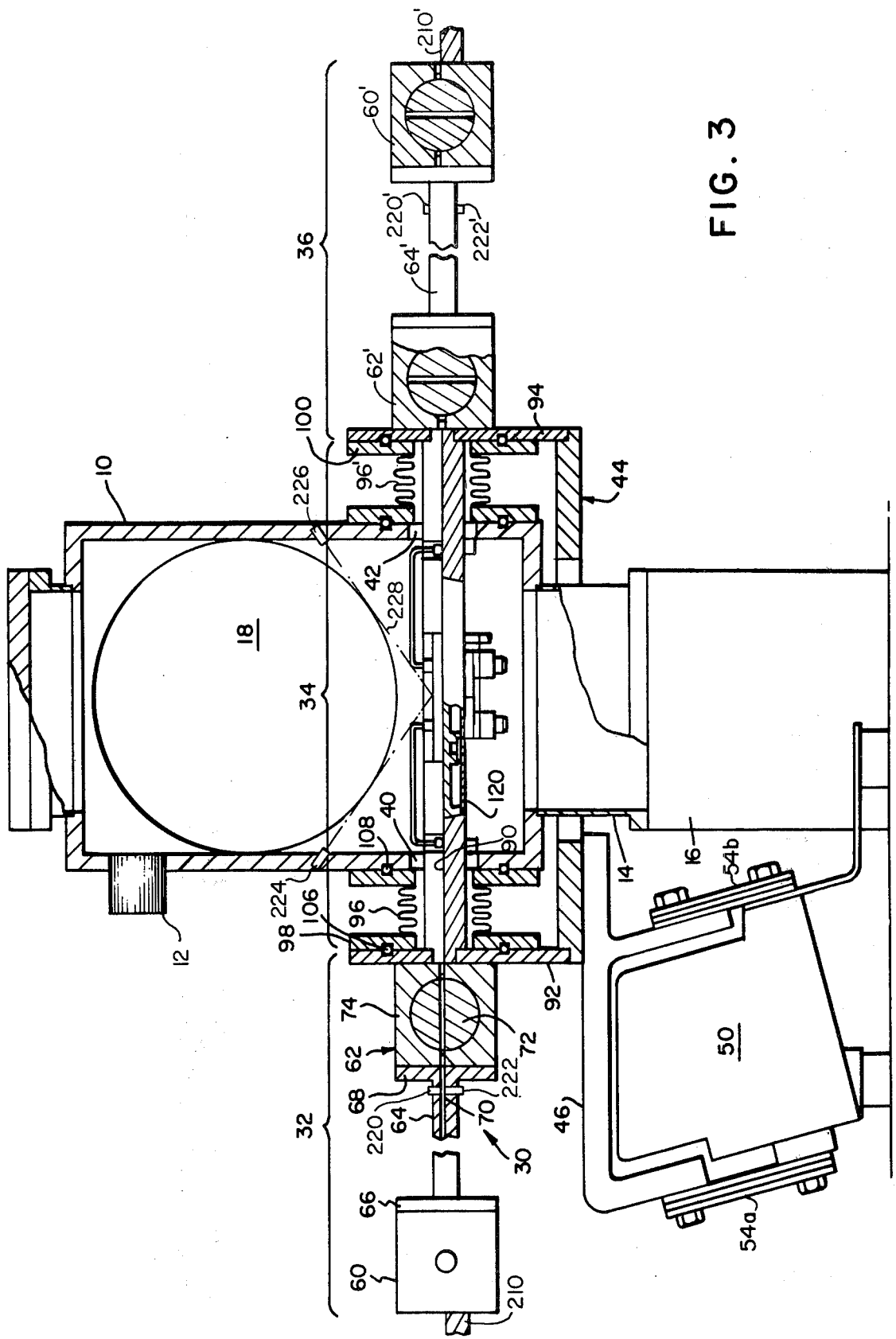
FIG. 3 is a vertical sectional view along the lines 3—3 of FIG. 2.
Figure 4:
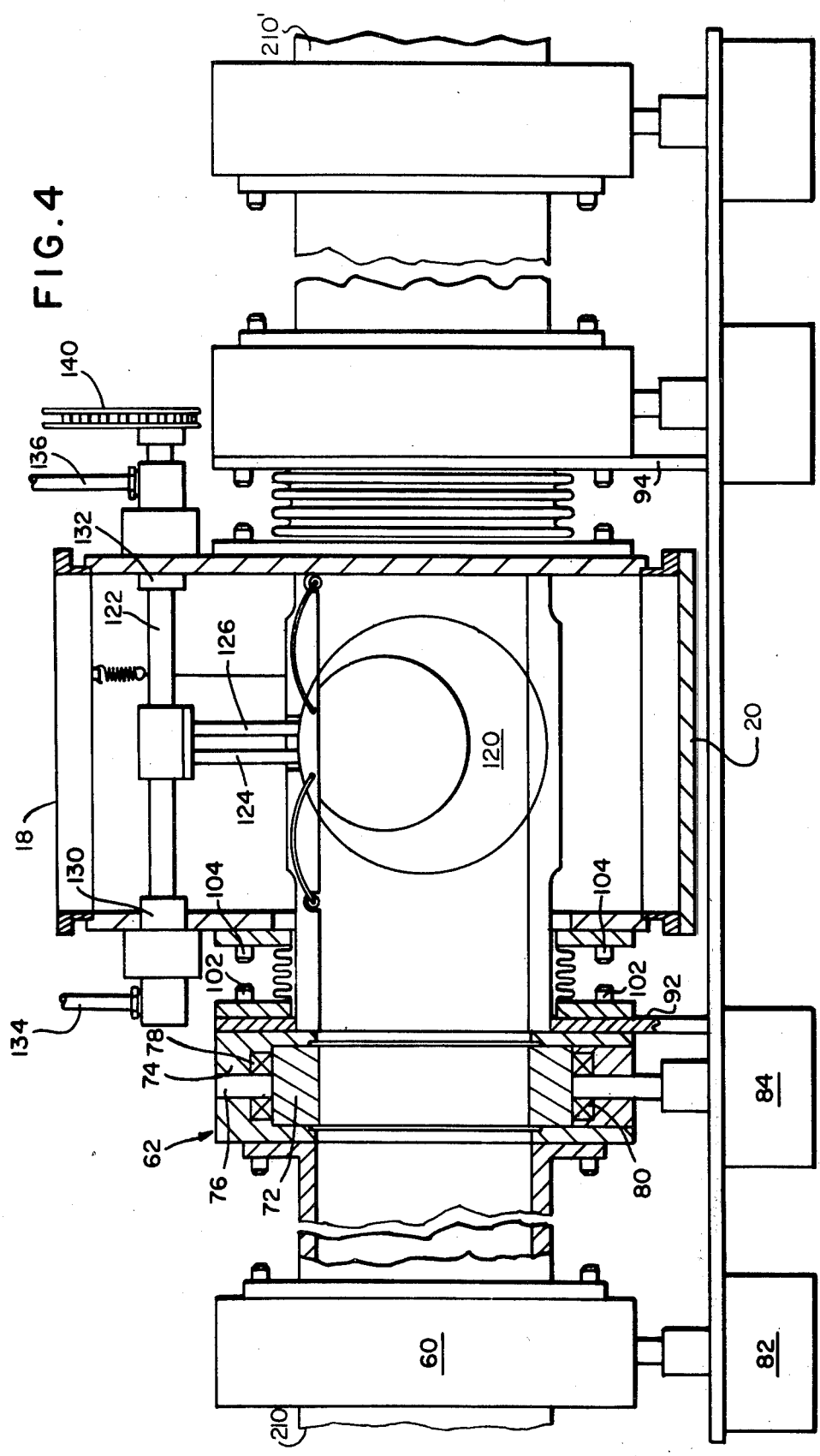
FIG. 4 is a horizontal plan view along the lines 4—4 of FIG. 2.
Figure 5:
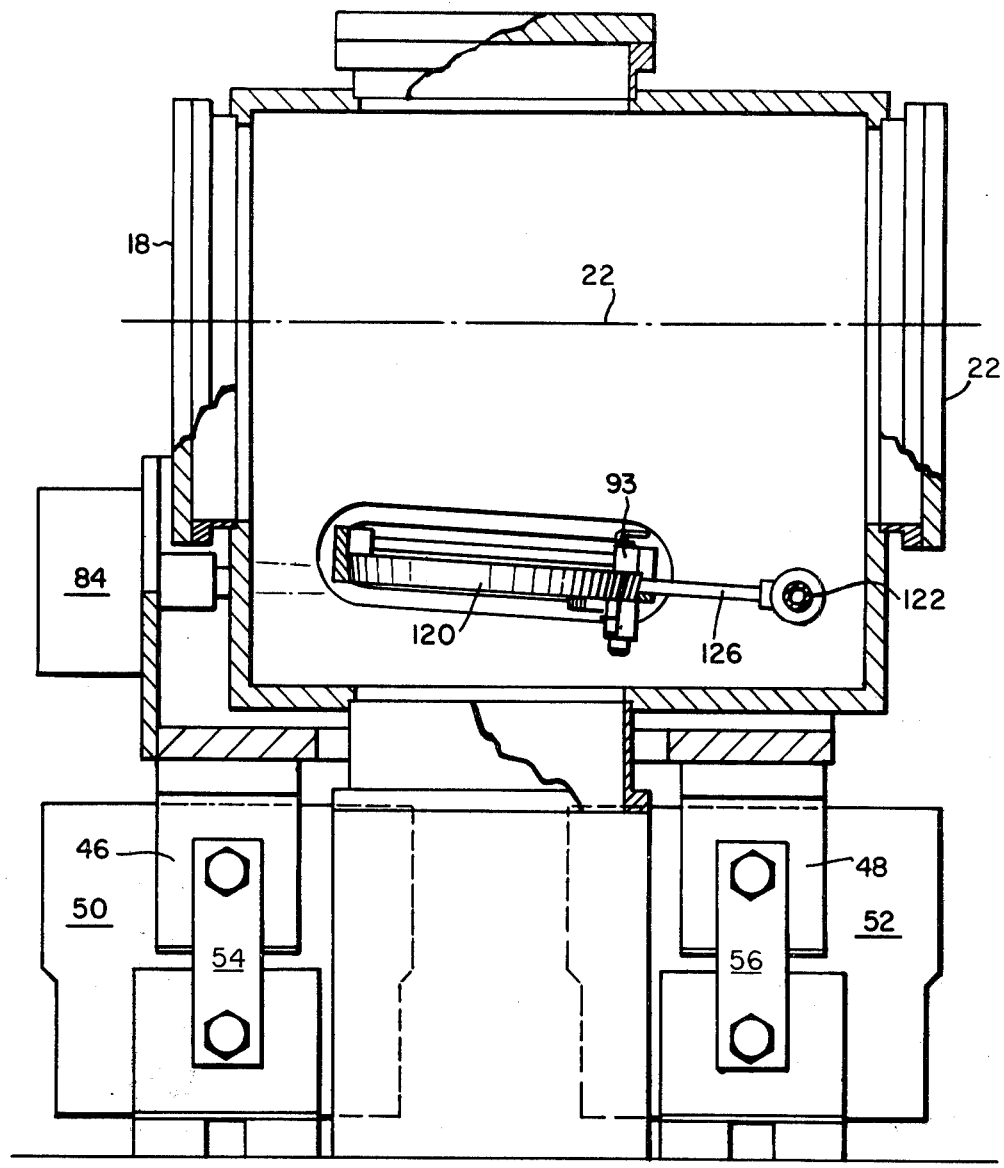
FIG. 5 is a vertical sectional view along the lines 5—5 of FIG. 2.

Considering specifically FIGS. 1-5, an air-tight chamber 10 is evacuated through a fitting 12 extending between the chamber and a vacuum pump (not shown). The chamber rests on a column 14 (FIG. 3) which is supported by a rigid base 16 and has a front port 18 and a rear port 20 through which an ion beam 22 is directed for selectively modifying the characteristics of a wafer moved into the path of the beam. In use, one or more of these ports is typically connected to an ion beam chamber which is then evacuated for processing the wafers. A closure plate seals the port not so connected, e.g., port 20.

A generally continuous track 30 formed from connected track sections 32, 34, 36, respectively, extends through an entrance aperture 40 and an exit aperture 42 of the chamber 10. The track 30 is supported from a yoke 44 independent of the chamber 10; the yoke 44 in turn rests on platforms 46, 48 which are driven by electromagnetic vibrators 50, 52 connected to the yokes 46, 48 by semi-rigid flexure straps 54, 56, respectively. The vibrators drive the platforms 46, 48 and cause them to undergo small amplitude vibrations along with the yoke 44 and track 30. The vibration has an upwardly-directed vertical component perpendicular to the track 30 and a horizontal component parallel to this track and directed to the right in FIG. 2.

The first track section 32 is formed from first and second pass-through valves 60, 62, respectively, and an enclosed track segment 64 in the form of a conduit terminating in vertical end plates 66, 68 respectively, which are connected to the valves 60, 62, respectively. The conduit 64 and the end plates 66, 68, each have an aperture 70 extending through them and of a size such as to accommodate the article to be processed. In the present illustration, the article comprises a semiconductor wafer and thus the conduit and aperture are wide and thin to conform to the wafer shape.

The valves 60 and 62 are identically constructed and only valve 62 will be described in detail. As shown particularly in FIGS. 3 and 4, valve 62 is formed from a cylindrical rotor 72 mounted for rotation within a parallelepiped housing 74 by means of a cylindrical shaft 76 and bearings 78 and 80. The shaft 72 and 74 have central apertures extending therethrough commensurate with, and aligned with, aperture 70 in the conduit 64. Solenoids 82, 84 (FIG. 2) control the rotation of the rotors of the valves 60, 62, respectively. When the aperture in the rotor is aligned with the apertures in the housing, the valve is opened and a wafer can pass through the valve from one side thereof to the other; when the rotor is not so aligned, the valve is closed. When both valves 60 and 62 are closed, the conduit segment 64 is sealed off at both its end to form a "forechamber" of limited volume. This forechamber is of sufficient length, that is, the valves 60 and 62 are spaced far enough apart, to accommodate a single wafer therein. This assists in accelerating the wafer processing, as will be described in more detail below. Further details of the construction may be obtained from U.S. Pat. No. 3,833,018 noted above.

The third track section 36 at the chamber exit is essentially identical to the first track section 32, having corresponding valves 60' and 62', forechamber 66', and bellows 96' and will not be described in further detail.

The second track section 34 comprises a track segment 90 extending between, and connecting at its opposite ends to end plates 92, 94 of yoke 44. The track segments 32 and 36 are also connected to these end plates, such as by welding or the like. A first elliptical bellows 96 is connected between a pair of end plates 98, 100; the bellows surrounds the entrance aperture 40 of chamber 10 and encompasses track section 34. End plate 98 is connected to end plate 92 by bolts 102 (FIG. 4) or the like, while end plate 100 is connected to the chamber 10 by means of bolts 104 or the like. O-ring seals 106, 108 form an air-tight seal at the connecting planes. A similar arrangement is provided at the exit end of the chamber 10 and will not further be described.

Disposed within the track 90 is a platen 120 connected for rotation about a shaft 122 by means of arms 124, 126; these arms, together with shaft 122, are formed with hollow-core interiors. The shaft 122 extends through rotary, air-tight fittings 130, 132 in the sidewalls of the chamber 10 and is connected via conduits 134, 136 to a water supply source and drain, respectively. During processing of a semiconductor wafer, water flows through the shaft 122 and arms 124, 126 and the interior of the platen 120 to cool the platen which is heated by bombardment of the ion beams. The shaft 122 is rotated from outside the chamber by means of a drive-link connection 140 which in turn is driven from a motor (not shown).

Figure 6:
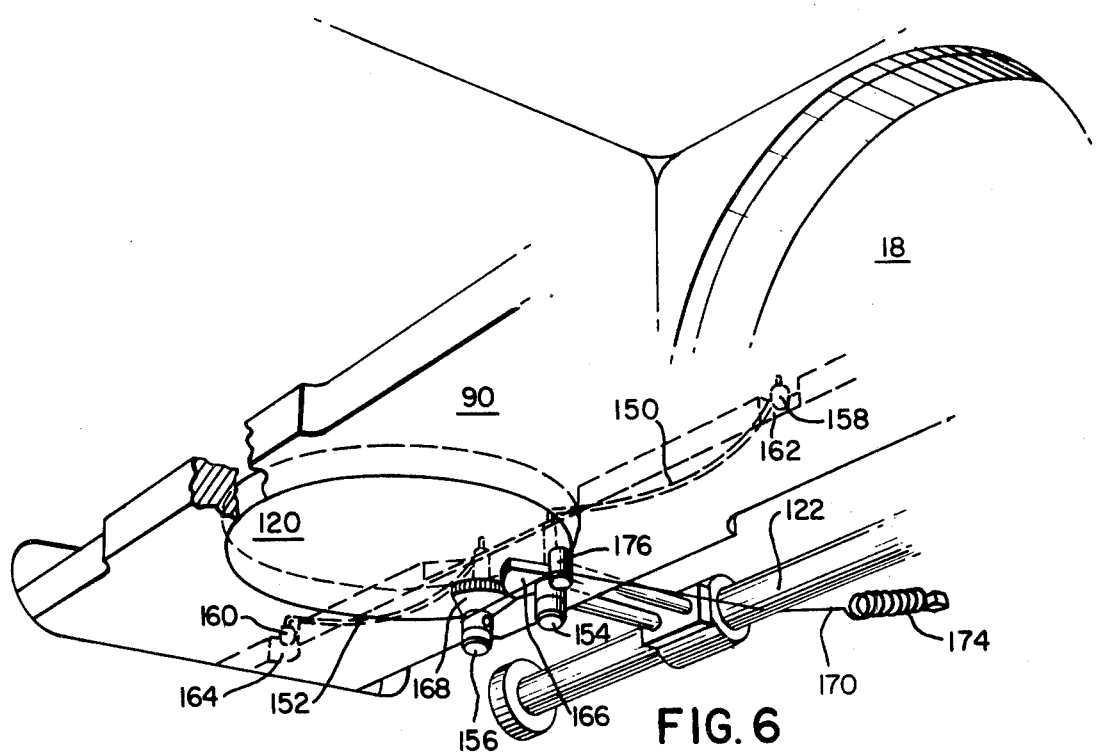
FIG. 6 is a view in perspective of the wafer-holding platen of the present invention in its load/unload position.
Figure 7:
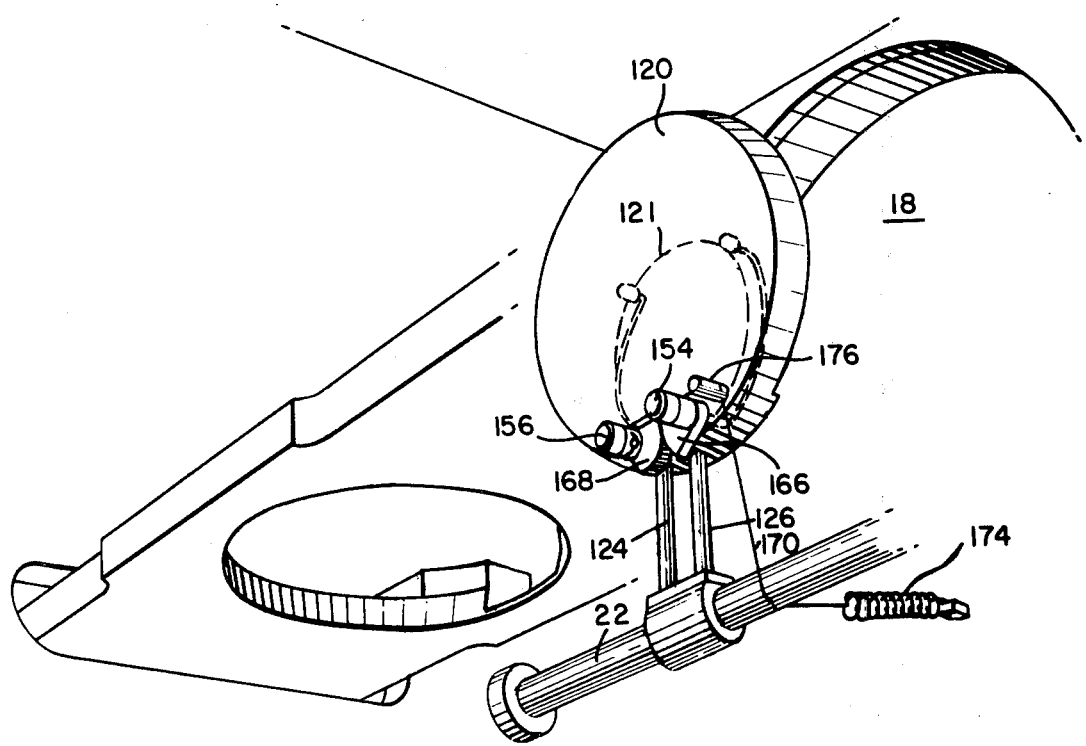
FIG. 7 is a view in perspective of the platen of FIG. 5 in the elevated position.

When the shaft 122 is rotated, it raises the platen 120 upwardly out of the track 90 and into a position where it intersects the ion beam 22 directed through the chamber windows 18, 20; this is shown more clearly in FIGS. 6 and 7 to which reference should now be made. A pair of arms 150, 152 connected to shafts 154, 156, respectively, which extend through the platen 120, have fingers 158, 160, respectively, which fit into corresponding notches 162, 164, respectively, in the track 90. Gears 166, 168 attached to shafts 154, 156 are positioned to intermesh with each other. A wire 170 has one end thereof connected to a spring 174 which in turn is connected to a wall (not shown) of the chamber 10; the other end of the wire 170 extends over a pin 176 connected to the underside of the platen and is tied to the shaft 156.

When the platen is in the rest position shown in FIG. 6, the wire 170 has several turns extending around the shaft 156. When the shaft 122 is thereafter rotated, the effective path length of the wire from the chamber wall to the shaft 156 increases since the wire bends around shaft 22 during rotation. Wire 170 thus unwinds from shaft 156, and, as it does so, it rotates the shaft 156 in the clockwise direction as seen from underneath the track 90 in FIG. 5. This in turn rotates the gears 166 and 168 into the position shown in FIG. 6 where the platen is fully elevated. As the platen is elevated, the arms 150, 152 rotate inwardly and engage the wafer on the platen to maintain it in position during processing. Due to the spring 174, wafers of different sizes are readily accomodated by the arms 150, 152, a feature of importance when production is rapdily shifted from one wafer type to another. As the platen 120 is returned toward the track 90, the gears 166, 168 rotate in the opposite direction and the arms 150, 152 swing outwardly of the platen to release the wafer carried on it. A spring (not shown) within shaft 156 reversely rotates the arms to the open position on return of the platen to the track.

Figure 10:
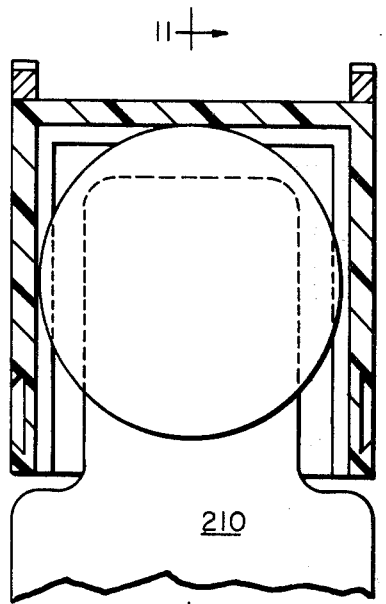
FIG. 10 is a horizontal sectional view of the loader/unloader system taken along the lines 10—10 of FIG. 1.
Figure 11:
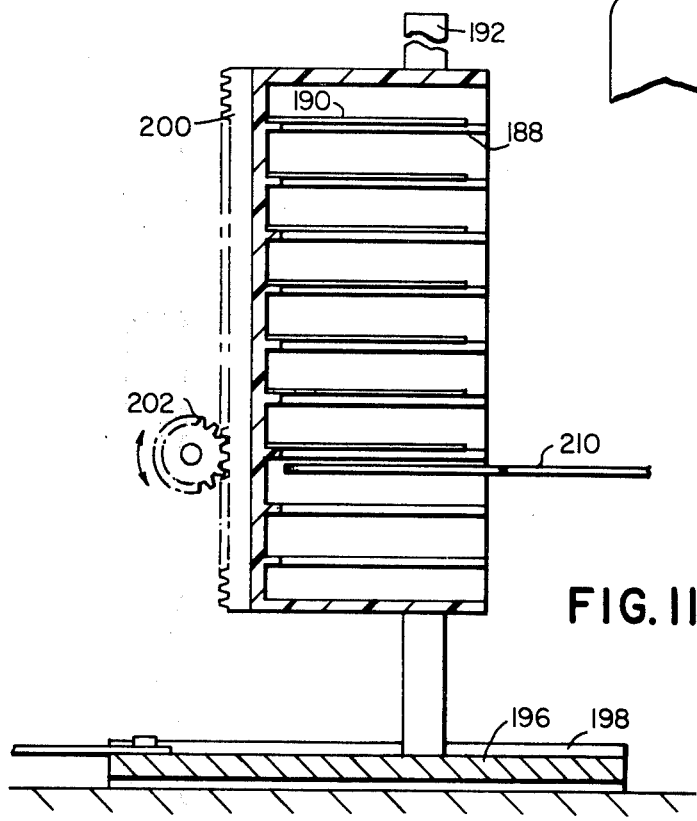
FIG. 11 is a vertical sectional view of the loader/unloader along the lines 11—11 of FIG. 10.

Referring now specifically to FIGS. 1, 10 and 11, wafers to be processed are supplied to the track 30 from a loader/unloader 180 comprising a casette 182 in the form of a rectangular box having sidewalls 184 and 186 and ribs 188 on the side walls extending transversely to an open face of the casette. The ribs define compartments within the casette for the reception of wafers 190 therein; they are spaced apart by a distance greater than the width of a wafer so as to allow a certain amount of "play" of the wafer therein. The casette is mounted for vertical motion on a pair of guides 192, 194 which in turn are mounted for horizontal motion on a platform 196 which slides within a housing 198. A rack 200 formed on the rear of casette 182 mates with a pinion 202 driven by a motor 204 to thereby vertically advance the casette. A motor 206 drives the platform 196 toward and away from the track 30.

A tongue-like extension 210 of the track 30 extends into the open face of the casette 182 and between adjacent wafers when the platform 196 is advanced toward the track. The casette is initially positioned such that the tongue is beneath the lowermost compartment containing a wafer to be processed. Each time the motor 204 indexes the casette downwardly a single wafer contacts the tongue 210 and is lifted from the ribs 188 onto the tongue. A similar loader/unloader 212 receives the wafers from the track 30 after processing and loads them one by one into a corresponding casette 214 which indexes upwardly, but starting with the tongue extension of the track at the uppermost compartment. The operation of the loader/unloader 212 is otherwise the same as that of the loader/unloader 180 and need not be described in further detail.

Mounted within each forechamber is a light source 220 and a light-responsive element 222 positioned to detect the presence or absence of a wafer in the forechamber. Similarly, a light source 224 (FIG. 3) is positioned to transmit light along a path 226 into a light-responsive element 228 on reflection from a wafer on platen 120 but not otherwise, to thereby detect when a wafer is on the platen. A controller 230 (FIG. 1) connected to receive the outputs of the light-responsive elements sequences the operation of the loader/unloader, the valves, and the platens, as will now be described in more detail. The track 30 is tilted slightly downwardly (from left to right in FIG. 1) to assist in moving the wafers along the track.

Figure 8:
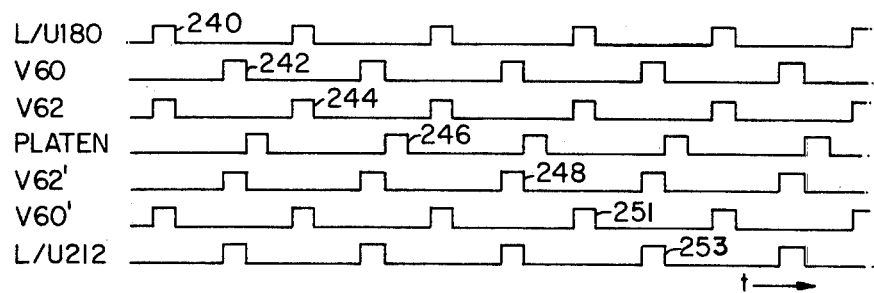
FIG. 8 is an illustrative timing waveform useful in explaining the invention.

Referring now to FIG. 8, an illustrative timing sequence that is useful in explaining the operation of the system is shown.

The operating sequence of the various components is illustrated by pulse-shaped wavefoms, with the horizontal axis representing time. When the waveform is "low" (pulse absent), the corresponding unit is considered to be in a passive or inoperative state, that is, in the case of a loader/unloader, it is stationary; in the case of a valve, it is closed; and in the case of the platen, it is in the lowered position. Conversely, when the waveform is "high" (pulse present), the corresponding unit is considered to be on or operative, that is, in the case of a loader/unloader, it is indexing to a new position; in the case of a valve, it is opened to allow passage of a wafer therethrough and in the case of the platen, it is in the rotated or elevated position.

To begin the processing, the motor 204 (See FIG. 1) is energized from the controller 230 to index the casette 182 downwardly. As the casette moves downwardly, the tongue 210 picks up a wafer 190 from the ribs 188. The tongue, being connected to, and forming part of, the track 30, vibrates with the track and thereby advances the wafer toward the valve 60. The travel time from the casette to the valve is indicated by the horizontal distance between the trailing edge of the waveform 240 and the front edge of the waveform 242. Valve 60 then opens (as indicated by waveform 242 in FIG. 8) to admit the wafer into the forechamber 64 and thereafter closes on receipt of a signal from sensor 222 indicating that the wafer has cleared the valve and is in the forechamber. The forechamber may now be "rough pumped" to a pressure intermediate that of the chamber 10 and atmospheric pressure by auxiliary pumping means (not shown) via a nozzle to minimize the vacuum loss in the main chamber when valve 62 is opened. Alternatively, the forechamber may be evacuated from the main chamber.

Valve 62 next opens to pass the wafer into the chamber 10. When the wafer moves onto the platen, as detected by lightsensor 226, the platen is thereupon elevated (waveform 246) to bring the wafer into the path of the beam 22 for processing. During the time it is elevated, the platen is decoupled from the track 30 and thus the vibration of the track has no effect on the wafer. This is important in ion implantation systems since vibration could cause scanning irregularities which could vary the electrical characteristics of the wafer in an undesired manner. However, the track is still vibrating and thus other wafers are being moved to or from the forechambers. This increases the processing rate.

After the wafer has been processed, the platen is again lowered. This returns the wafer to the track and it travels toward the valve 62. The latter is then opened (waveform 248) and the wafer passes through it. This also exposes the interior of chamber 10 to the interior volume of forechamber 64' and thus the forechamber 64' is preferably "rough-pumped" prior to opening valve 62'. Like the forechamber 64, the latter is of small volume relative to the main chamber and vacuum conditions in the main chamber are again quickly restored. After entrance into the forechamber 64', as detected by the output of lightsensor 222', valve 62' closes and, shortly thereafter, valve 60' opens (waveform 251). Wafer 190 then passes through the valve 60' onto the tongue 210' and then into the casette 212. Thereafter the casette is indexed (waveform 253) to accept a subsequent wafer.

From FIG. 8, it will be noted that there may be several wafers on the track 30 at a given time. For example, while one wafer is traveling through forechamber 64 toward valve 64, another is passing through forechamber 64' and still another has just been loaded onto the loader/unloader 212'. Thus, transport of the wafer to and from the processing chamber can take place during the processing without unduly disturbing the processing operation and this greatly accelerates the production rate.

Further acceleration of the production rate may be obtained by aligning two or more systems of the type illustrated and described herein and interconnecting their chambers 10 so that the beam 22 travels through both chambers in succession. While the platen in one chamber is elevated, that in the other chamber is depressed so that only one platen will be in the beam path at a given time. The units are thus operated in a tandem or "push-pull" mode to thereby further increase the production rate.

Figure 9:
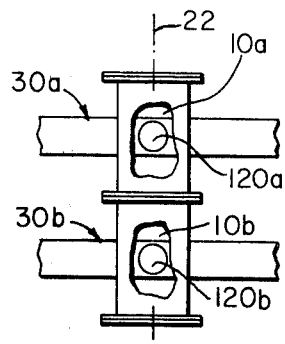
FIG. 9 is a sketch illustrating the utilization of a pair of transport systems in accordance with the invention for parallel processing lines.

This is illustrated schematically in FIG. 9 in which first and second chambers 10A and 10B are placed face to face with their tracks 30A and 30B parallel to each other and side by side. Wafers are fed along both tracks simultaneously, and a single controller is utilized such that platen 120A of chamber 10A is elevated while platen 120B of chamber 10B is depressed, and vice versa.

Figure 12:
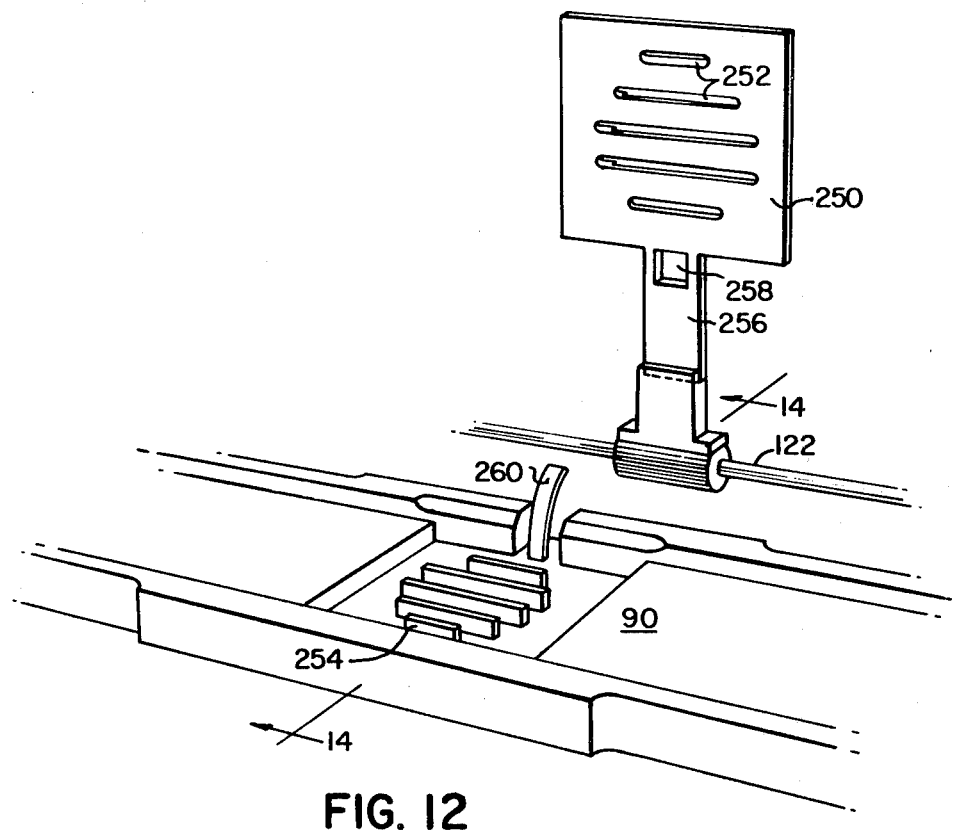
FIG. 12 is a rear view in perspective of an alternative wafer-transfer platen in accordance with the invention.
Figure 13:
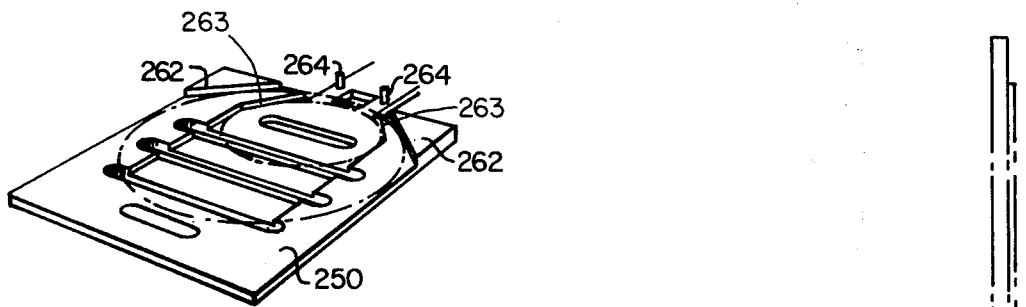
FIG. 13 is a view in perspective of the front face of the platen.
Figure 14:
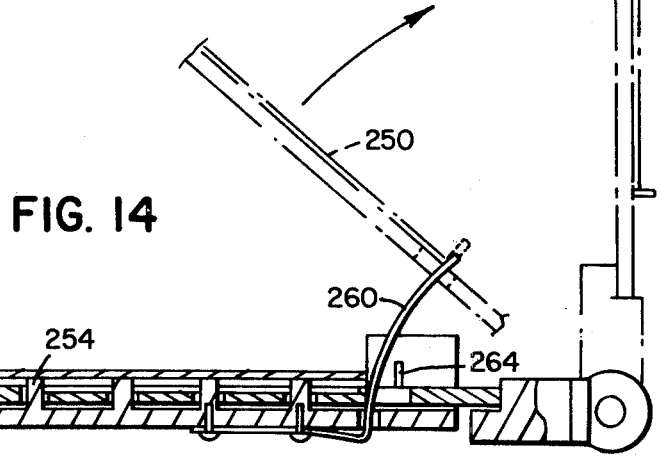
FIG. 14 is a vertical view along the lines 14—14 of FIG. 13.

An alternative form of platen is illustrated in FIGS. 12 through 14. The platen 250 shown there comprises a rectangular plate having apetures 252 therein which are made with corresponding islands 254 carried on track 90. The platen 250 rotates about shaft 122. An arm 256 which connects platen 250 to shaft 122 has an aperture 258 through which a guide 260 attached to the track 90 passes. Pairs of triangular ridges 262 and 263 on the front face of platen 250 serve as supports for wafers of different diameters, (e.g. 1 ½-3 ¼ inches in diameter) while a pair of pins 264 serve as safety stops.

The top faces of the islands 254 are aligned with the wafer-bearing or upper surface of the track 90 so that they support a wafer on the same level as this track. When the platen is rotated into an elevated position, however, it lifts the wafer from the islands for processing by beam 22. The guide 260 eases the wafer onto the supports 262 or 264, as the case may be.

CONCLUSION

From the foregoing, it will be seen that we have provided an improved article transport system. The system is uniquely suited to transporting an article into and out of a sealed environment such as a vacuum chamber, but it will be understood that it may be used in connection with other sealed environments. For example, some processing operations extensively irradiate materials, and it is necessary to contain this radiation from the environment. This is done in chambers which are "radiation sealed" and the artcle handling system of the present invention is particularly useful in connection with these applications also. Further, microwave processing operations are generally conducted in a chamber that is isolated or sealed from its environment, and the present invention is particularly useful in transporting articles into and out of such a chamber. Other processing operations for which the present invention is well suited also suggest themselves to those skilled in the art.

Further, we have provided a loader/unloader which is particularly well adapted to the transport system of the present invention and, when used with that system, needs no separate drive source.

Finally, we have provided an improved article handler particularly well adapted to the article transporter for efficiently removing articles from the transporter and returning them to it. The article handler has a minimum of moving parts and is efficient and reliable in operation.

It will be understood that various changes may be made by those skilled in the art without departing from either the spirit or the scope of the invention and it is intended that the foregoing be taken as illustrative only, and not in a limiting sense, the scope of the invention being defined with particularity in the claims.

We claim:

1. A loader/unloader for wafers, comprising:
   A. a cassette for holding a plurality of wafers thereon in spacd apart position, and having an open face through which said wafers may be removed from, or supplied to, said cassette;
   B. said cassette including at least first and second side walls having ribs on the interior surfaces thereof for supporting the wafers thereon and spaced apart in a vertical direction by an amount at least slightly greater than the thickness of the wafer to be stored therein;
   C. a tongue extensible into said face and between said wafers, said tongue having a portion adapted to convey said wafers away from or to said cassette;
   D. the ribs on opposed side walls of the cassette being spaced apart at an amount sufficient to accommodate passage of said tongue therebetween;
   E. means bringing said tongue into contact with said wafers; and
   F. means vibrating said tongue to thereby transfer wafers between said tongue and cassette.

2. The loader/unloader of claim 1 further including means mounting said cassette for vertical motion whereby wafers may be removed from, or supplied to, successive storage spaces in said cassette as said cassette is moved.

3. The loader/unloader of claim 1 wherein the means vibrating said tongue is adapted to advance wafers thereon along the tongue.

4. The loader/unloader of claim 1 wherein the means bringing said tongue into contact with said wafers includes
   (1) motor means energizable to move said cassette with respect to said tongue, and
   (2) a controller for selectively energizing said motor means.

5. The loader/unloader of claim 1 further comprising:
   A. means for mounting said cassette for movement in a first direction; and
   B. the means bringing said tongue into contact with said wafers including means selectively indexing the cassette in the mounting means and moving the cassette in said first direction to bring the tongue into article-supporting relation with wafers in said cassette.

6. The loader/unloader of claim 5 in which the means vibrating said tongue comprises:
   (1) a platform connected to said tongue for movement therewith;
   (2) flexure means supporting said platform; and
   (3) electromagnetic driver means for vibrating said platform to thereby impart limited vibratory motion to said tongue.

7. The loader/unloader of claim 5 wherein the ribs define compartments and the means indexing the cassette indexes the cassette one compartment at a time.

8. The loader/unloader of claim 1 wherein the tongue has a flat base portion and opposed side walls forming a shallow trough for moving a wafer therealong and being of substantially greater mass than said wafer.

9. In a semiconductor processing system for processing semiconductor wafers such as silicon wafers, the system having a processing station including a sealable vacuum chamber and means for supplying wafers to the processing station, the means for supplying wafers to the processing station including a cassette for holding a plurality of wafers thereon in spaced apart position and having an open face through which said wafers may be removed from/or supplied to, said cassette, the improvement comprising:

A. a tongue extensible into said cassette face and between said wafers;

B. means bringing said tongue into contact with said wafers;

C. means vibrating said tongue to thereby transfer wafers between said tongue and said cassette;

D. said means vibrating said tongue having associated therewith a vibrating track for transporting wafers between said tongue and said sealable vacuum chamber.

* * * * *